(12) United States Patent
Kotera et al.

(10) Patent No.: US 6,977,555 B2
(45) Date of Patent: Dec. 20, 2005

(54) TUNER CIRCUIT

(75) Inventors: Sadao Kotera, Kusatsu (JP); Hiroshi Taniguchi, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 27 days.

(21) Appl. No.: 10/706,086

(22) Filed: Nov. 13, 2003

(65) Prior Publication Data
US 2004/0113702 A1 Jun. 17, 2004

(30) Foreign Application Priority Data
Dec. 17, 2002 (JP) .............................. 2002-365512

(51) Int. Cl.[7] .............................................. H03F 3/191

(52) U.S. Cl. ..................... 330/305; 330/378; 348/731

(58) Field of Search ................................ 330/278, 305; 348/731

(56) References Cited

U.S. PATENT DOCUMENTS

| 4,019,160 A | * | 4/1977 | Kam | 330/302 |
| 4,369,414 A | * | 1/1983 | Aoki et al. | 330/145 |
| 4,668,882 A | * | 5/1987 | Matsuura | 327/308 |
| 6,037,999 A | * | 3/2000 | Kunishima | 348/731 |
| 6,081,151 A | * | 6/2000 | Boulic | 327/308 |

FOREIGN PATENT DOCUMENTS

JP          10-276109          10/1998

* cited by examiner

Primary Examiner—Khanh V. Nguyen
(74) Attorney, Agent, or Firm—Keating & Bennett, LLP

(57) ABSTRACT

A tuner circuit includes a variable attenuator circuit including a PIN diode, disposed upstream of a variable-gain amplifier circuit and controlled according to the same AGC voltage used to control the variable-gain amplifier circuit. The operations of the variable-gain amplifier circuit and the variable attenuator circuit in relation to the AGC voltage are set such that when an input RF signal is at a maximum assumed level, a direct current that flows through the PIN diode will be less than a value of a direct current that maximizes intermodulation distortion.

11 Claims, 4 Drawing Sheets

AGC VOLTAGE

TO MIXER CIRCUIT

TUNER CIRCUIT

BACKGROUND OF THE INVENTION

1. Field of the Invention

The present invention relates to tuner circuits, and particularly to a tuner circuit for a cable television (CATV) set.

2. Description of the Related Art

A tuner circuit for a CATV set, similarly to a tuner circuit 1 according to the present invention, shown in a block diagram in FIG. 1, includes a variable bandpass filter (BPF) 5 that functions as an input tuning circuit for tuning to the vicinity of a signal of a desired channel among signals of a large number of channels, a variable-gain amplifier circuit 6 for amplifying or attenuating the level of a signal output from the variable BPF 5 to a prescribed level, and a narrow-band variable BPF 7 for tuning to a signal of a desired channel in an even narrower range among a signal output from the variable-gain amplifier circuit 6.

The variable-gain amplifier circuit 6 operates such that the gain thereof is reduced in accordance with an automatic-gain-control (AGC) voltage with a desired gain as a reference point. Thus, although the overall operation of the variable-gain amplifier circuit 6 is amplification, since the gain changes in accordance with the AGC voltage in a direction of attenuation with respect to the reference point, the change in gain will be expressed as "attenuation". For example, the AGC voltage is set based on a level of a signal demodulated in a demodulation circuit disposed downstream of the tuner circuit such that the level of the demodulated signal is constant. The level of the demodulated signal is detected, for example, by an AGC detection circuit disposed downstream of the demodulation circuit.

With the above-described components alone, return loss (RL) of the tuner circuit 1 with regard to the variable BPF 5 and thereafter as viewed from the input terminal 2 is large (reflection is small) at frequencies of a signal of a desired channel, and return loss is small (reflection is large) at other frequencies. Since tuner circuits for CATV sets are connected to a common cable, if a channel having a large reflection exists as described above, a characteristic impedance mismatch of the cable occurs at that channel which could cause negative effects on, for example, the operation of a tuner circuit for a CATV set of another home. Thus, to improve return loss characteristics over the entire channel bands, a wide-band pre-amplifier circuit 4 that functions as a buffer amplifier and a low-noise amplifier is provided. The pre-amplifier circuit 4 also improves isolation such that a local oscillation signal is prevented from leaking from a mixer circuit included in the tuner circuit 1 to the cable via the input terminal 2.

The level of an RF signal input to a tuner circuit for a CATV set varies considerably; for example, about −15 to about +15 dBmV according to U.S. specifications and about −7 to about +25 dBmV according to Japanese specifications. Thus, distortion often occurs in the pre-amplifier circuit 4 or in the variable-gain amplifier circuit 6 when the signal level is high. To prevent distortion, a variable attenuator circuit 3 including a PIN diode connected in series with the signal path is provided at an upstream side of the pre-amplifier circuit 4, and the attenuation in the variable attenuator circuit 3 is controlled according to the same AGC voltage used to control the variable-gain amplifier circuit 6, thereby inhibiting a signal at a high level from entering the pre-amplifier circuit 4.

A tuner circuit configured as described above is disclosed, for example, in Japanese Unexamined Patent Application Publication No. 10-276109.

Japanese Unexamined Patent Application Publication No. 10-276109 discloses a tuner circuit in which only a variable-gain amplifier functions as an attenuator to achieve the overall AGC operation while the level of an input RF signal is small, and in which a variable attenuator circuit starts to function as an attenuator only when the level of the RF signal has become large. Japanese Unexamined Patent Application Publication No. 10-276109 discloses that the above-described arrangement maintains a favorable noise factor (NF) while the level of the RF signal is small and also suppresses distortion in the variable-gain amplifier circuit when the level of the RF signal is large.

In the tuner circuit disclosed in Japanese Unexamined Patent Application Publication No. 10-276109, attenuation is achieved primarily by the variable-gain amplifier circuit, such that the attenuation in the variable attenuator circuit does not substantially increase even when the level of an input RF signal is considerably large. This means that a signal at a high level passes through the variable attenuator circuit without being substantially attenuated.

Regarding the variable attenuator circuit including the PIN diode disposed in series with the signal path, FIGS. 2A and 2B show the relationship between the level of intermodulation distortion and the level of an output signal corresponding to a direct current that flows through the PIN diode where the level of an input signal is about 10 dBm. FIG. 2A shows second-order intermodulation distortion (IM2), and FIG. 2B shows third-order intermodulation distortion (IM3). Since the level of the input signal is constant, FIGS. 2A and 2B indicate that the attenuation decreases as the level of the output signal increases. As will be understood from FIGS. 2A and 2B, the attenuation is substantially zero when the direct current is approximately 1 mA or greater, such that in actual operation, the direct current is maintained at no more than approximately 0.5 mA. The intermodulation distortion is small when the direct current is large and the attenuation is small; it increases as the direct current decreases and the attenuation increases, and reaches a peak when the direct current reaches a certain value; and it rapidly decreases when the direct current is approximately 100 µA or less and the attenuation continues to increase.

When a positive-intrinsic-negative (PIN) diode that functions as a variable attenuator circuit is connected in series with the signal path as described above, while the attenuation is relatively small, intermodulation distortion increases as the attenuation increases.

Furthermore, since the attenuation in the variable attenuator circuit is small and a signal at a high level passes through the variable attenuator circuit, a signal at a high level is input to the pre-amplifier circuit. Thus, distortion inevitably occurs in the pre-amplifier circuit.

SUMMARY OF THE INVENTION

To overcome the problems described above, preferred embodiments of the present invention provide a tuner circuit in which intermodulation distortion in a variable attenuator circuit is greatly suppressed and in which distortion in a pre-amplifier circuit is greatly suppressed.

According to a preferred embodiment of the present invention, a tuner circuit includes an input terminal, an input tuning circuit for tuning to an RF signal of a desired channel among RF signals of a plurality of channels input from the input terminal, a variable-gain amplifier circuit for amplifying or attenuating a level of an RF signal output from the input tuning circuit to a prescribed level, a pre-amplifier circuit disposed at an upstream side of the input tuning circuit, and a variable attenuator circuit disposed at an upstream side of the pre-amplifier circuit including a PIN diode disposed in series with a signal path of the tuner circuit, the PIN diode having characteristics between direct current and intermodulation distortion such that intermodulation distortion of a signal that flows therethrough is maximized at a desired value of a direct current, wherein the variable-gain amplifier circuit and the variable attenuator circuit are controlled according to a common AGC voltage that is set based on a level of an input RF signal, and wherein operations of the variable-gain amplifier circuit and the variable attenuator circuit in relation to the AGC voltage are set such that when the input RF signal is at a maximum level, a direct current that flows through the PIN diode is less than the desired value of a direct current that maximizes intermodulation distortion.

In the tuner circuit, preferably, the operations of the variable-gain amplifier circuit and the variable attenuator circuit in relation to the AGC voltage are set such that the direct current that flows through the PIN diode is less than about 100 $\mu$A when the input RF signal is at the maximum level.

In the tuner circuit, preferably, the AGC voltage is initially set based on a signal level of a channel having the smallest gain at a signal-level detecting point.

According to preferred embodiments of the present invention, when the level of an input RF signal is large, the attenuation in the variable attenuator circuit increases to suppress distortion in the pre-amplifier circuit disposed at the immediate downstream side of the variable attenuator circuit. Furthermore, when the level of an input RF signal is large, the PIN diode functions in a characteristic region where intermodulation distortion is small to suppress intermodulation distortion in the variable attenuator circuit.

The above and other elements, characteristics, features, steps and advantages of the present invention will become clear from the following description of preferred embodiments taken in conjunction with the accompanying drawings.

DETAILED DESCRIPTION OF PREFERRED EMBODIMENTS

Figure 1:
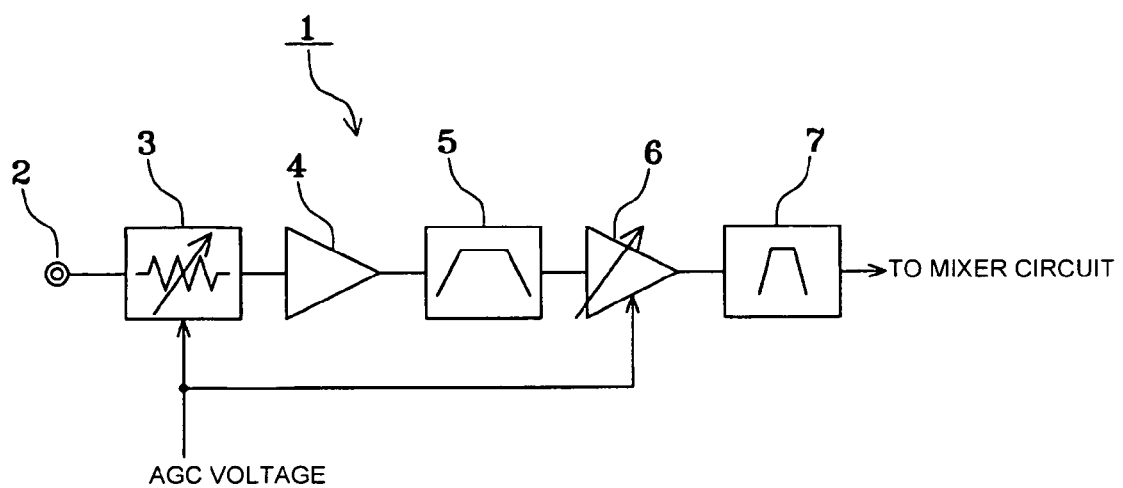
FIG. 1 is a block diagram of a tuner circuit according to a preferred embodiment of the present invention.

FIG. 1 is a block diagram showing a tuner circuit according to a preferred embodiment of the present invention. As described earlier in the section describing the related art, a tuner circuit 1 according to preferred embodiments of the present invention does not differ from a tuner circuit according to the related art at the level of the block diagram. The tuner circuit according to preferred embodiments of the present invention is characterized by a method of controlling a variable attenuator circuit 3 and a variable-gain amplifier circuit 6 using a common AGC voltage.

Figure 3:
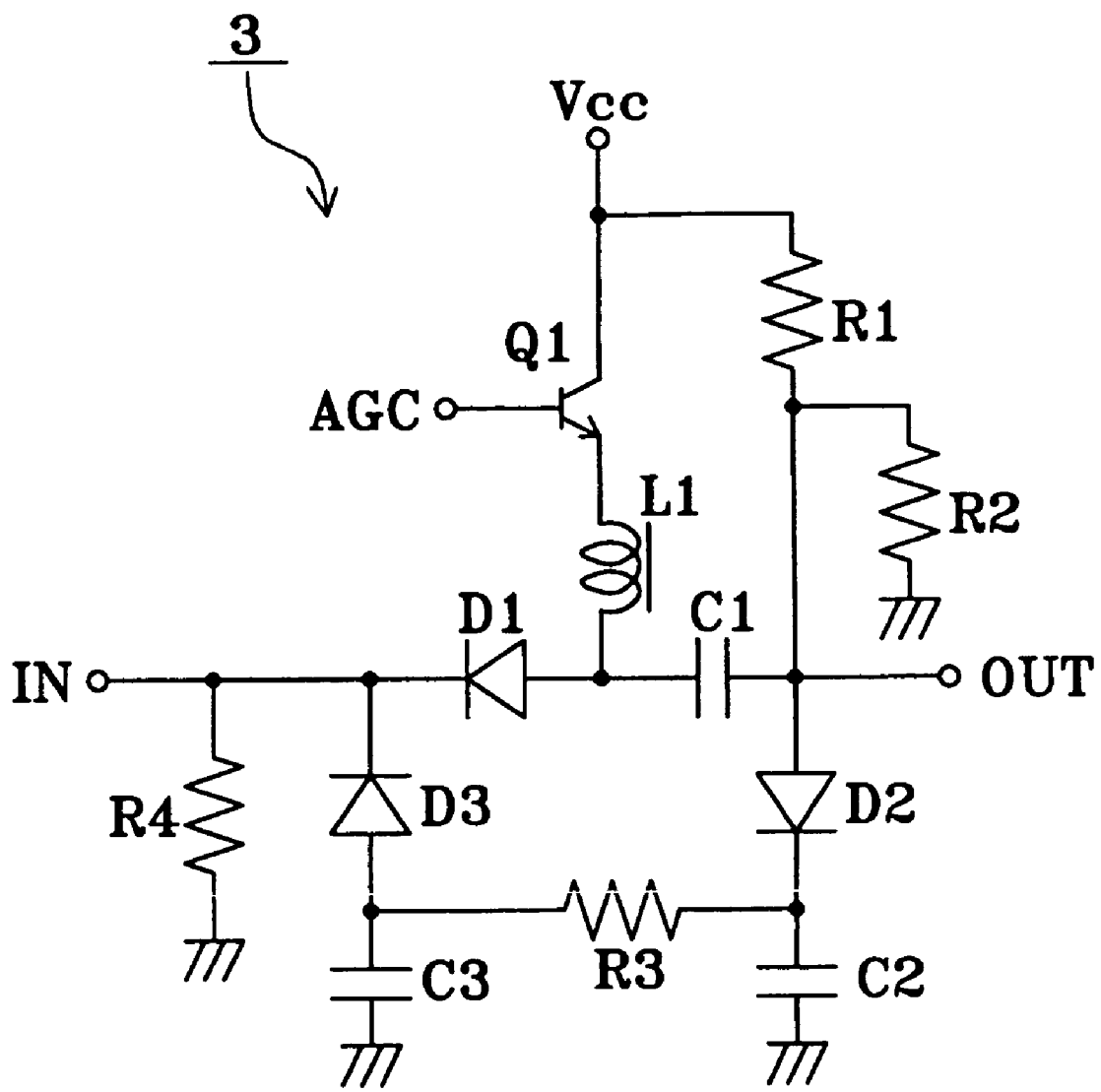
FIG. 3 is a circuit diagram of the variable attenuator circuit in the tuner circuit shown in FIG. 1.

FIG. 3 shows a specific circuit diagram of the variable attenuator circuit 3. The variable attenuator circuit 3 includes three PIN diodes D1, D2, and D3, which define a main portion of the variable attenuator circuit 3, a transistor Q1, a choke coil L1, resistors R1, R2, R3, and R4, and capacitors C1, C2, and C3.

The cathode of the PIN diode D1 is connected to an input terminal IN, and the anode of the PIN diode D1 is connected to an output terminal OUT via the capacitor C1 for removing a DC component. The anode of the PIN diode D1 is also connected to the emitter of the transistor Q1 via the choke coil L1. The collector of the transistor Q1 is connected to a DC power source Vcc. The base of the transistor Q1 receives an AGC voltage input.

The output terminal OUT is connected to the DC power source Vcc via the resistor R1, and is grounded via the resistor R2. The anode of the PIN diode D2 is connected to the output terminal OUT, and the cathode of the PIN diode D2 is grounded for high frequencies via the capacitor C2. The cathode of the PIN diode D3 is connected to the input terminal IN, and the anode of the PIN diode D3 is grounded for high frequencies via the capacitor C3. The cathode of the PIN diode D2 is connected to the anode of the PIN diode D3 via the resistor R3. The input terminal IN is grounded via the resistor R4.

Although not shown, the input terminal IN and the output terminal OUT are each connected to a capacitor for removing a DC component.

In the variable attenuator circuit 3 configured as described above, the AGC voltage input to the base of the transistor Q1 is at a high level (e.g., +4 V) when the level of a signal demodulated in a demodulation circuit disposed at a downstream side of the tuner circuit 1 is low, that is, when the level of a signal input to the tuner circuit 1 is low. The AGC voltage decreases towards 0V as the level of the demodulated signal increases, that is, as the level of the signal input to the tuner circuit 1 increases. That is, the AGC voltage is set according to the level of a demodulated signal assuming that the level of the demodulated signal indirectly indicates the level of an RF signal. A position at which the level of the demodulated signal is detected in the circuitry, that is, a position where an AGC detection circuit for detecting a demodulated signal and converting the demodulated signal into an AGC voltage, will be referred to as a signal-level detecting point.

Since the variable attenuator circuit 3 is configured as described above, when the level of the signal input to the tuner circuit 1 is low, the resistance between the collector and emitter of the transistor Q1 becomes low, such that a large DC current flows through the PIN diode D1. Thus, the resistance of the PIN diode D1 becomes low, and the potential at the cathode of the PIN diode D1 becomes high. Since the potential at the cathode of the PIN diode D1 is high, the potential difference between the terminals of a series circuit defined by the PIN diode D2, the resistor R3, and the PIN diode D3 becomes small, such that the DC current that flows between the PIN diodes D2 and D3 is small. Thus, the resistance of the PIN diodes D2 and D3 increases. The PIN diodes D1, D2, and D3 essentially constitute a $\pi$-shaped attenuation circuit. When the level of the input signal is low, the resistance of the PIN diode D1 disposed in series with the signal path becomes low, so that the attenuation is reduced.

On the other hand, when the level of the signal input to the tuner circuit 1 is high, the resistance between the collector and emitter of the transistor Q1 becomes high, such that the DC current that flows through the PIN diode D1 decreases. Thus, the resistance of the PIN diode D1 increases, and the potential at the cathode of the PIN diode D1 decreases. Since the potential at the cathode of the PIN diode D1 becomes low, the potential difference between the terminals of the series circuit defined by the PIN diode 2, the resistor R3, and the PIN diode D3 becomes large, such that the DC current that flows through the PIN diodes D2 and D3 becomes large. Thus, the resistance of the PIN diodes D2 and D3 decreases. When the level of the input signal is high, the resistance of the PIN diode D1 disposed in series with the signal path becomes large, such that the attenuation in the π attenuation circuit defined by the PIN diodes D1, D2, and D3 becomes large. The attenuation in the variable attenuator circuit 3 is controlled according to the AGC voltage as described above.

Figure 4:
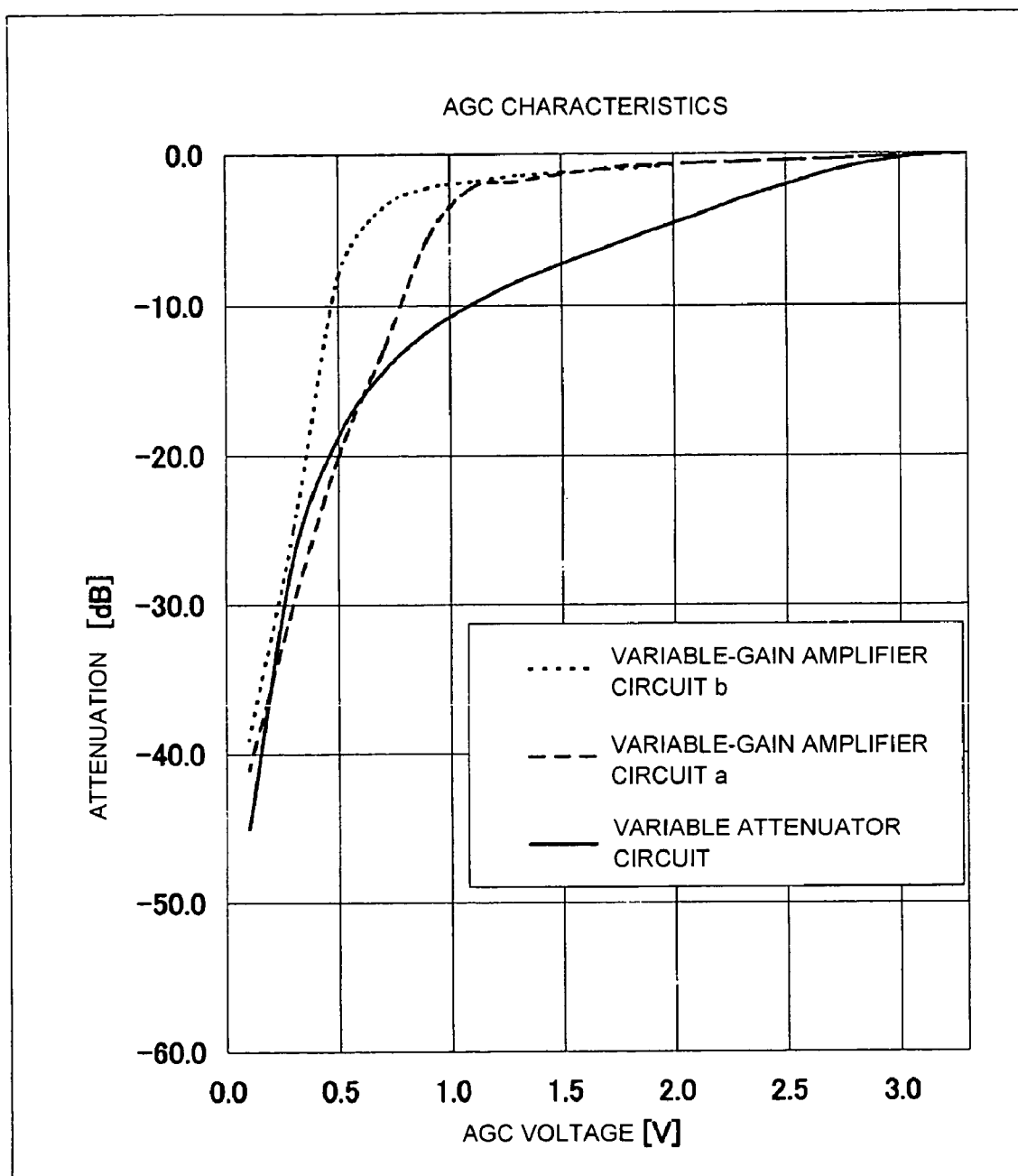
FIG. 4 is a characteristics diagram showing attenuation characteristics of the variable attenuator circuit and a variable-gain amplifier circuit in the tuner circuit shown in FIG. 1.

In FIG. 4, the attenuation characteristics of the variable attenuator circuit 3 are shown by a solid line. Referring to FIG. 4, the horizontal axis represents the level of the AGC voltage, and the vertical axis represents attenuation. As described earlier, in the variable attenuator circuit 3, the attenuation is small when the level of the AGC voltage is high, and the attenuation increases as the level of the AGC voltage decreases.

In the tuner circuit 1 according to preferred embodiments of the present invention, the attenuation of the variable-gain amplifier 6 is also controlled according to the same AGC voltage used to control the variable attenuator circuit 3. In FIG. 4, the attenuation characteristics of the variable-gain amplifier circuit 6 are shown simultaneously by two types of dashed lines. As described earlier, the vertical axis represents attenuation with a predetermined attenuation as a reference point. Also in the variable-gain amplifier circuit 6, the attenuation is small when the level of the AGC voltage is high, and the attenuation increases as the level of the AGC voltage decreases. The variable-gain amplifier circuit 6 has a generally known arrangement, so that a specific circuit diagram and description thereof will be omitted.

In FIG. 4, attenuation characteristics of two variable-gain amplifier circuits (variable-gain amplifiers a and b) are shown by two types of dashed lines. In the attenuation characteristics of the two circuits, attenuation begins at different times in relation to reduction in the AGC voltage. In this example, attenuation begins later in the variable-gain amplifier circuit b than in the variable-gain amplifier a in relation to reduction in the AGC voltage. To put it conversely, attenuation begins earlier in the variable-gain amplifier circuit a than in the variable-gain amplifier circuit b in relation to reduction in the AGC voltage. In FIG. 4, the attenuation characteristics of the variable-gain amplifier circuit a in which attenuation begins earlier are the attenuation characteristics in the tuner circuit according to the related art, and the attenuation characteristics of the variable-gain amplifier circuit b in which attenuation begins later are the attenuation characteristics in the tuner circuit according to preferred embodiments of the present invention. The attenuation characteristics of the two variable-gain amplifier circuits are shown because it is easier to change attenuation characteristics of a variable-gain amplifier circuit than to change attenuation characteristics of a variable attenuator circuit including a PIN diode.

In the tuner circuit according to preferred embodiments of the present invention, attenuation in the variable-gain amplifier circuit begins later than in the tuner circuit according to the related art. According to the related art, a region of AGC voltage exists in which the attenuation in the variable-gain amplifier circuit is greater than that in the variable attenuator circuit (about 0.2V to about 0.6V in FIG. 4). According to preferred embodiments of the present invention, attenuation begins later than in the related art, such that the attenuation in the variable attenuator circuit is always greater than that in the variable-gain amplifier circuit. Thus, when the level of an input RF signal is large, the RF signal is considerably attenuated in the variable attenuator circuit 3. The attenuation in the variable attenuator circuit 3 increases as the level of the RF signal increases. When the attenuation in the variable attenuator circuit 3 is large, the direct current that flows through the PIN diode disposed in series with the signal path in the variable attenuator circuit 3 is small. That is, the operations of the variable-gain amplifier 6 and the variable attenuator circuit 3 in relation to the AGC voltage are set such that when the input RF signal is at a maximum assumed level; the direct current that flows through the PIN diode disposed in series with the signal path is less than a value of a direct current that maximizes intermodulation distortion.

Figure 2A:
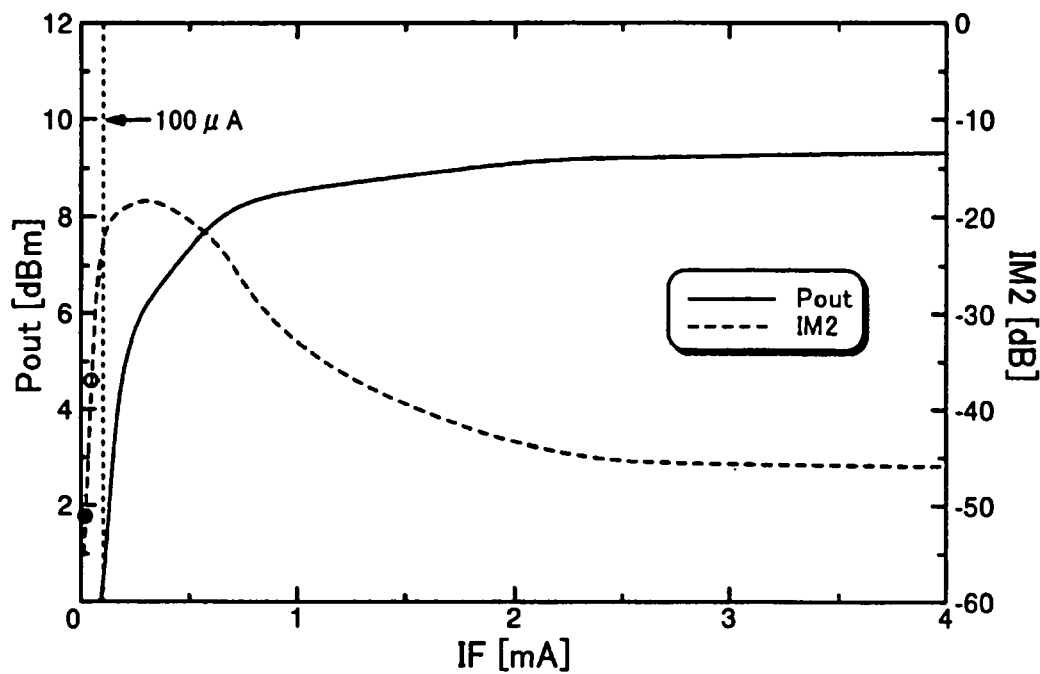
FIGS. 2A and 2B are characteristics diagram showing a relationship between intermodulation distortion and a direct current that flows through a PIN diode in a variable attenuator circuit in the tuner circuit shown in FIG. 1.
Figure 2B:
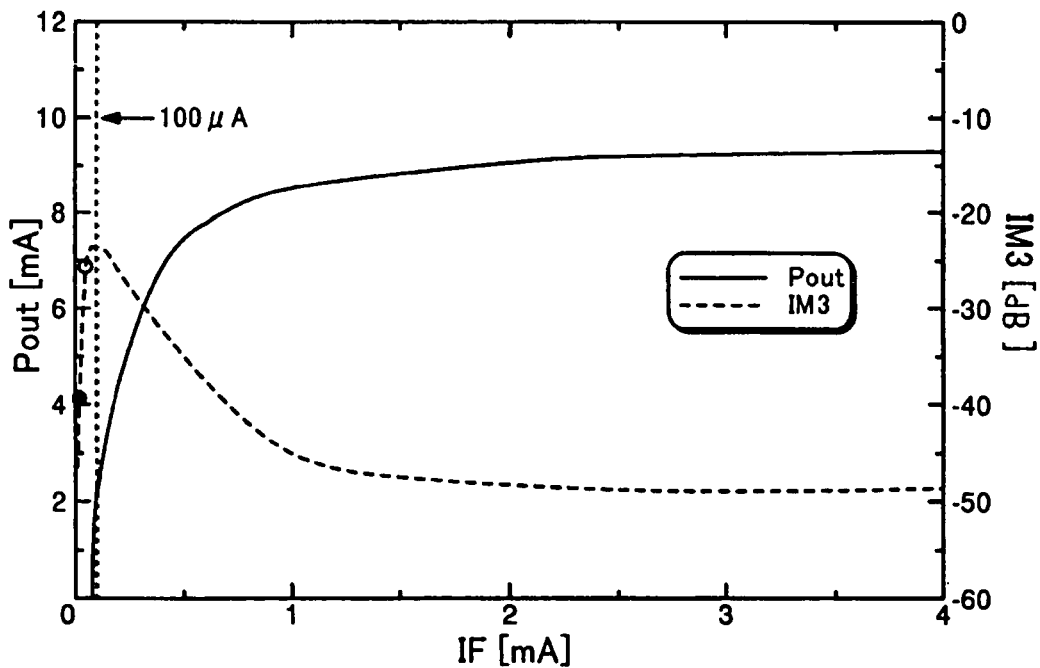

More specifically, as will be understood from FIGS. 2A and 2B, intermodulation distortion is maximized when the value of the direct current that flows the PIN diode disposed in series with the signal path of the variable attenuator circuit 3 is approximately 100 μA. Thus, the operations of the variable-gain amplifier circuit 6 and the variable attenuator circuit 3 in relation to the AGC voltage are set such that a direct current that flows through the PIN diode disposed in series with the signal path of the variable attenuator circuit 3 will not be greater than about 100 μA (e.g., 50 μA) when an RF signal of the maximum assumed level in input. To cause attenuation in the variable-gain amplifier circuit 6 to begin later than in the related art is a way of achieving the above-described condition.

By setting the operations of the variable-gain amplifier circuit 6 and the variable attenuator circuit 3 as described above, when the level of an input RF signal is large, the attenuation in the variable attenuator circuit 3 increases which inhibits an unnecessarily large signal from entering the pre-amplifier circuit 4. Thus, distortion in the pre-amplifier circuit 4 is greatly suppressed.

Furthermore, when the level of the input RF signal is large, the PIN diode functions in the characteristic region where intermodulation distortion is small, suppresses intermodulation distortion in the variable attenuator circuit.

In the preferred embodiment described above, a relationship with the variable attenuator circuit 3 is set by changing the attenuation characteristics of the variable-gain amplifier circuit 6. Alternatively, if it is possible to change the attenuation characteristics of the variable attenuator circuit 3 and fix the attenuation characteristics of the variable-gain amplifier 6.

If the setting is such that the direct current that flows through the PIN diode disposed in series with the signal path of the variable attenuator circuit 3 is less than the value of a direct current that maximizes intermodulation distortion when an RF signal of a maximum level assumed is input, intermodulation distortion decreases as the level of the input signal increases. To put it conversely, the intermodulation distortion increases as the level of the input signal decreases in the region. Furthermore, since the level of the input signal rarely reaches the maximum assumed level and is usually less than the maximum level, it is undesirable that intermodulation distortion increases in the usual state.

However, the characteristics shown in FIGS. 2A and 2B assume that the level of the input signal is constant. Actually, when the attenuation in the variable attenuator circuit is smaller, the level of the input signal is also smaller. Since intermodulation distortion rapidly decreases as the level of the input signal decreases, even if the value of the direct current that flows through the PIN diode is the value that maximizes intermodulation distortion, effective intermodulation distortion is small if the level of the input signal at that time is low which does not cause a problem.

The AGC voltage used to control the variable attenuator circuit 3 and the variable-gain amplifier circuit 6 is determined based on the level of a signal at the signal-level detecting point, i.e., the level of a signal obtained by converting an RF signal into an IF signal and demodulating the IF signal. Ideally, if the levels of RF signals in all the channels are the same, the levels of demodulated signals should be the same. However, amplifier circuits and tuning circuits, and conversion gain of a mixer circuit for converting an RF signal into an IF signal have varying frequency characteristics. Thus, even if the levels of RF signals of channels are the same, the levels of signals at the signal-level detecting point are not necessarily the same. Since the AGC voltage is determined based on the signal level at the signal-level detecting point, even if the level of RF signals of channels are the same, the value of AGC voltage could differ, that is, the attenuation in the variable attenuator circuit 3 or the variable-gain amplifier circuit 6 could differ.

If the AGC voltage is initially set based on a channel having a relatively large gain at the signal-level detecting point, in channels having smaller gains, even when the levels of RF signals are large, the AGC voltage is set assuming that the levels of RF signals are smaller than the actual values. Thus, the attenuation in the variable attenuator circuit 3 or the variable-gain amplifier circuit 6 is insufficient for some channels, such that even when the level of an input RF signal is the maximum assumed level, it is possible that the direct current that flows through the PIN diode will not be less than the value of a direct current that maximizes intermodulation distortion. In order to avoid this problem, the AGC voltage must be initially set based on a signal level of a channel having a smallest gain at the signal-level detection point.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A tuner circuit comprising:
   an input terminal;
   an input tuning circuit for tuning to an RF signal of a desired channel among RF signals of a plurality of channels input from the input terminal;
   a variable-gain amplifier circuit for amplifying or attenuating a level of an RF signal output from the input tuning circuit to a prescribed level;
   a pre-amplifier circuit disposed at an upstream side of the input tuning circuit; and
   a variable attenuator circuit disposed at an upstream side of the pre-amplifier circuit, including a PIN diode disposed in series with a signal path of the tuner circuit, the PIN diode having characteristics between direct current and intermodulation distortion such that intermodulation distortion of a signal that flows therethrough is maximized at a desired value of a direct current; wherein
   the variable-gain amplifier circuit and the variable attenuator circuit are controlled according to a common AGC voltage that is set based on a level of an input RE signal, and operations of the variable-gain amplifier circuit and the variable attenuator circuit in relation to the AGC voltage are set such that when the input RF signal is at a maximum assumed level, a direct current that flows through the PIN diode is less than the predetermined value of a direct current that maximizes intermodulation distortion.

2. A tuner circuit according to claim 1, wherein the operations of the variable-gain amplifier circuit and the variable attenuator circuit in relation to the AGC voltage are set such that the direct current that flows through the PIN diode is less than about 100 $\mu$A when the input RF signal is at the maximum assumed level.

3. A tuner circuit according to claim 1, wherein the AGC voltage is initially set based on a signal level of a channel having the smallest gain at a signal-level detecting point.

4. A tuner circuit according to claim 2, wherein the AGC voltage is initially set based on a signal level of a channel having the smallest gain at a signal-level detecting point.

5. A tuner circuit according to claim 1, wherein the variable attenuator circuit includes at least three PIN diodes.

6. A tuner circuit according to claim 5, wherein the at least three PIN diodes are arranged to constitute a $\pi$-shaped attenuation circuit.

7. A tuner circuit according to claim 1, wherein the variable attenuator circuit includes a transistor, a choke coil, a plurality of resistors, and a plurality of capacitors.

8. A tuner circuit according to claim 1, wherein a cathode of the PIN diode is connected to the input terminal.

9. A tuner circuit according to claim 1, wherein an anode of the PIN diode is connected to an output terminal via at least one capacitor.

10. A tuner circuit according to claim 7, wherein an anode of the PIN diode is connected to an emitter of the transistor via the choke coil.

11. A tuner circuit according to claim 7, wherein the transistor is arranged such that a base of the transistor receives an AGC voltage input.

* * * * *